(12) United States Patent
Nakamura et al.

(10) Patent No.: US 7,166,184 B2
(45) Date of Patent: Jan. 23, 2007

(54) MULTI-STAGE TYPE PROCESSING APPARATUS

(75) Inventors: Akihiko Nakamura, Kanagawa (JP); Taiichiro Aoki, Kanagawa (JP); Seiji Ohishi, Kanagawa (JP); Tamotsu Sasaki, Tokyo (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/778,947

(22) Filed: Feb. 16, 2004

(65) Prior Publication Data

US 2004/0179173 A1 Sep. 16, 2004

(30) Foreign Application Priority Data

Feb. 20, 2003 (JP) ............................. 2003-043068

(51) Int. Cl.
*G03B 27/32* (2006.01)
*H01L 21/68* (2006.01)

(52) U.S. Cl. ................. 156/345.22; 134/113; 134/902; 156/345.55; 118/719

(58) Field of Classification Search ................ 134/113, 134/1.3, 85, 87, 121, 902, 153, 157, 114; 118/719, 730; 156/345.22, 345.55; 355/27
See application file for complete search history.

(56) References Cited

U.S. PATENT DOCUMENTS 5,514,214 A * 5/1996 Joel et al. ...................... 118/52
5,989,342 A * 11/1999 Ikeda et al. .................... 118/52
6,126,338 A * 10/2000 Akimoto ....................... 396/611
6,247,479 B1 * 6/2001 Taniyama et al. ........... 134/95.2
6,444,029 B1 * 9/2002 Kimura et al. ................ 118/52
6,702,900 B1 * 3/2004 Yeh et al. ..................... 118/730

FOREIGN PATENT DOCUMENTS

| JP | 06-163498 | 6/1994 |
|---|---|---|
| JP | 06-216104 | 8/1994 |
| JP | 2000-049215 | 2/2000 |

* cited by examiner

*Primary Examiner*—Ram Kackar
*Assistant Examiner*—Sylvia R. MacArthur
(74) *Attorney, Agent, or Firm*—Carrier, Blackman & Associates, P.C.; Joseph P. Carrier; William D. Blackman

(57) ABSTRACT

A multi-stage type processing apparatus which can be positioned in a limited space without having a complicated driving mechanism, includes processing units which are stacked in a multi-stage state in the vertical direction. Each processing unit has a cup surrounding a substrate and a chuck for retaining and rotating a substrate, and the cup can be elevated and lowered with respect to the chuck. A cylinder unit is contracted and thereby all the cups are unitarily lowered, so that the top surface of the chuck is located in a slightly upper position with respect to the top surface of the cup. In this state, a substrate is mounted on the chuck and attracted. Next, the cylinder unit is extended and thereby all the cups are unitarily elevated so as to accommodate the substrate therein. In this state, developing liquid is dropped from a nozzle for developing liquid onto the center of the substrate, and a motor is driven to rotate the chuck (the substrate) via a drive shaft and a timing belt to allow the developing liquid to cover the entire surface of the substrate.

9 Claims, 5 Drawing Sheets

MULTI-STAGE TYPE PROCESSING APPARATUS

BACKGROUND OF THE INVENTION

1. Field of the Invention

The present invention relates to a multi-stage type processing apparatus which can conduct processing such as development to a plurality of substrates at the same time.

2. Description of the Prior Art

Recently, trials of forming a thick film on a surface of a substrate have been performed. For example, it is necessary to form a resist film having a thickness of around 20 μm so as to form a protruding electrode, which is referred to as a bump, having a height of around 20 μm on a surface of an IC pattern by applying integrated circuit forming technology.

In addition, wire bonding, which has conventionally been used for mounting an IC chip on a substrate, requires labor and time because it is necessary to connect metal wires one by one in wire bonding. Thus, instead of wire bonding, there is another way, in which a plurality of metal posts are provided on a chip, and the chip is mounted on a substrate via the posts. Since the metal posts have a height of around 100 μm, it is necessary to form a resist film having a thickness of around 100 μm so as to form metal posts by applying integrated circuit forming technology.

It takes 3–30 minutes per substrate to conduct development processing to such a thick resist film. Therefore, there have been conducted trials of batch type processing in which 1 cassette (25 substrates) is immersed in a development tank at one time to reduce time for development. However, this type requires a great volume of developing liquid and also exchange of substrates.

Documents 1–3 disclose simultaneous cleaning of a plurality of substrates (wafers).

In Document 1, a cassette accommodating a plurality of substrates is set in a rotor which is driven by a motor, and the substrates in the cassette are cleaned while the rotor is being rotated.

Document 2 discloses a cleaning device which is comprised of a wafer cassette and a washing liquid ejection means. In this device, the wafer cassette has a disk body and a plurality of tubular members provided on the disk body at a predetermined interval, each tubular member having a spinner, and the washing liquid ejection means is a nozzle which is provided in each tubular member so as to be movable back and forward.

Document 3 discloses a system in which processing units, each unit comprising a cup and a chuck provided in the cup, are positioned in a multi-stage state in the vertical direction. Each chuck is rotated by drive force which is distributed from a drive shaft provided in the vertical direction by using a timing belt, and substrates are exchanged by elevating and lowering the chuck.

Document 1: Japanese Patent Application Publication Hei 6-163498

Document 2: Japanese Patent Application Publication Hei 6-216104

Document 3: Japanese Patent Application Publication 2000-49215 (paragraph 0034, FIGS. 4 and 7)

Applications of the devices disclosed in Document 1 and Document 2 enables simultaneous processing to plural substrates without using a great volume of developing liquid.

However, these devices are large in the lateral direction, and are not efficient in terms of space.

Also, in the device disclosed in Document 3, the chuck is elevated and lowered for exchanging substrates. Therefore, the chuck needs both a mechanism for elevating and lowering and a mechanism for rotating, thus the whole structure becomes complicated.

SUMMARY OF THE INVENTION

According to a first aspect of the present invention, for the purpose of overcoming the problems mentioned above, there is provided a multi-stage type processing apparatus comprising a plurality of processing units which are provided apart from each other in the vertical direction, each unit having a cup surrounding a substrate and a chuck for retaining and rotating a substrate, wherein the cups and the chucks are separated, all the cups being supported by an elevator member so as to be elevated and lowered unitarily and all the chucks being supported by a fixing member, and rotation drive force is distributed from a drive shaft which is positioned in the vertical direction.

Since the cups and the chucks are separated, that is, the rotated member and the elevated and lowered member are supported separately, the chuck does not need to perform complicated movements, and the apparatus can be a balanced one as a whole.

In a case where the processing apparatus according to the present invention is used as a developing apparatus, one of an ejection nozzle for developing liquid and an ejection nozzle for rinse liquid is provided on the elevator member with respect to each processing unit, and the other is provided on the fixing member with respect to each processing unit.

It is also possible to provide the ejection nozzle for developing liquid and the ejection nozzle for rinse liquid apart from the elevator member and the fixing member. For example, in a case where a plurality of multi-stage type processing apparatuses are disposed, an arm rotated with respect to a horizontal plane is provided in the center, the ejection nozzle for developing liquid or the ejection nozzle for rinse liquid is attached to the arm, and the ejection nozzle for developing liquid or the ejection nozzle for rinse liquid can move back and forward to the upper portion of the processing unit by rotation of the arm.

Waste solution pipes, each of which connects to each cup, may be supported to be elevated and lowered unitarily by the elevator member. In this instance, the waste solution pipes may be joined into one pipe and connected to a gas-liquid separator in a state of being slidable.

Also, if only one drive shaft is provided, biased friction will easily occur between the shaft and a bearing for supporting the shaft, and assembly work will become difficult. Thus, the drive shaft is divided into plural ones with respect to each processing unit, and each of the divided shafts are jointed by a universal joint.

By driving the plural shafts with a single motor, it is possible to reduce non-uniformity of processing among the processing units, and uniform processing can be achieved. If a single drive shaft is rotated by a single motor, since each device is very sensitive, there will be a slight difference between the devices even in the same conditions. However, by transmitting the motion of the single motor, it is possible to overcome the sensitivity, and the same processing can be conducted to a material to be processed.

Incidentally, a timing belt is provided between each chuck and each drive shaft, and drive force is transmitted by using the timing belt.

DETAILED DESCRIPTION OF THE PREFERRED EMBODIMENTS

Hereinafter, embodiments according to the present invention will be explained with reference to the attached drawings. In the embodiments, a processing apparatus is used as a developing apparatus.

Figure 1:
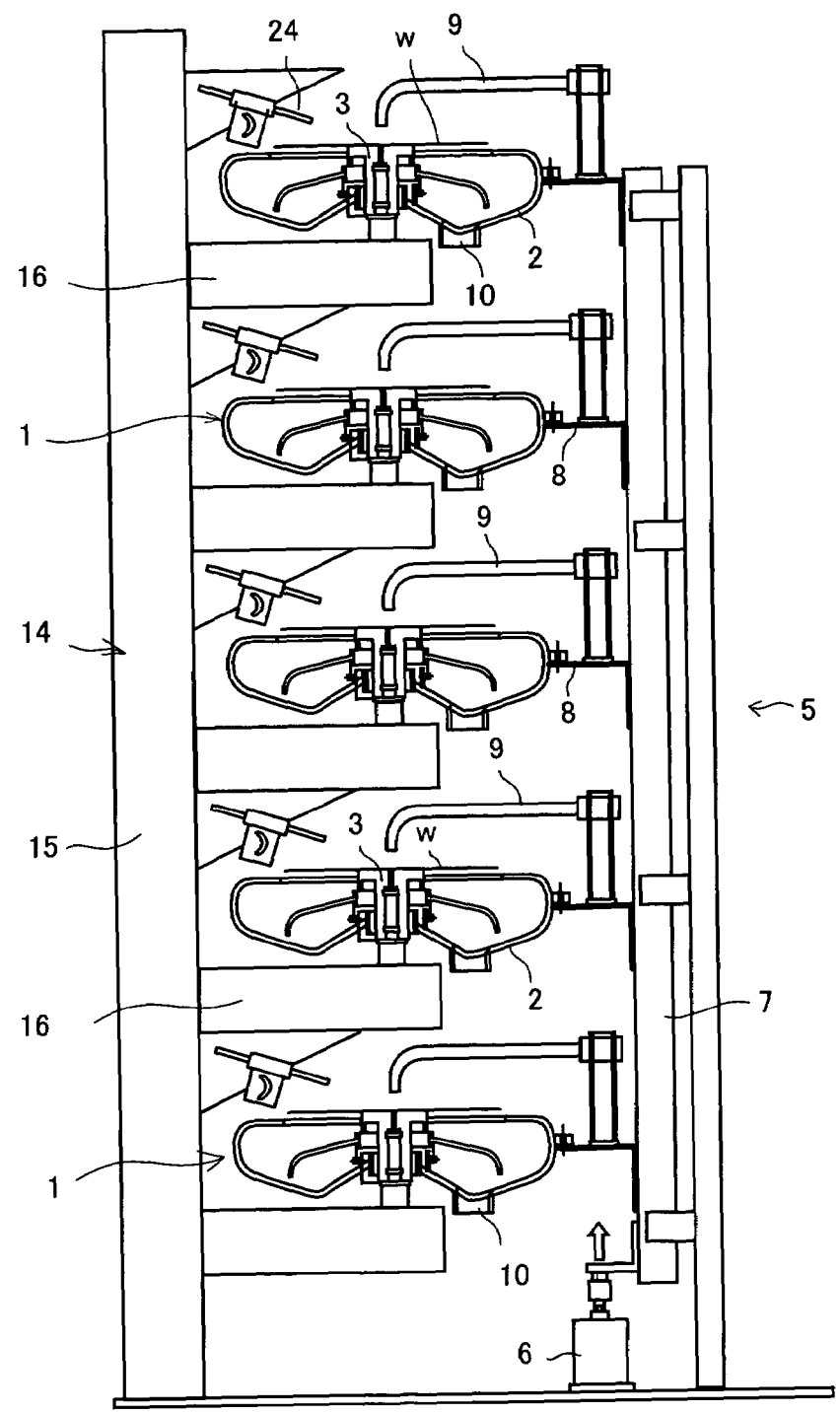
FIG. 1 shows the whole structure of a processing apparatus according to the present invention.

As shown in FIG. 1, the processing apparatus is comprised of processing units 1 which are stacked in a multi-stage state in the vertical direction. Each processing unit 1 has a cup 2 surrounding a substrate and a chuck 3 for retaining and rotating a substrate, and the cup 2 can be elevated and lowered with respect to the chuck 3.

Each cup 2 (the total number: 5) is supported by an elevator member 5. The elevator member 5 is comprised of a supporting post 7 which is elevated and lowered by a cylinder unit 6, and horizontal arms 8 which are attached to the supporting post 7 at the same interval. The cup 2 is fixed to the arm 8. Also, a nozzle for developing liquid 9 is attached to the arm 8, and the end of the nozzle for developing liquid 9 corresponds to the center of the chuck 3.

The nozzle for developing liquid 9 may be attached to a bracket instead of the arm 8.

Figure 2:
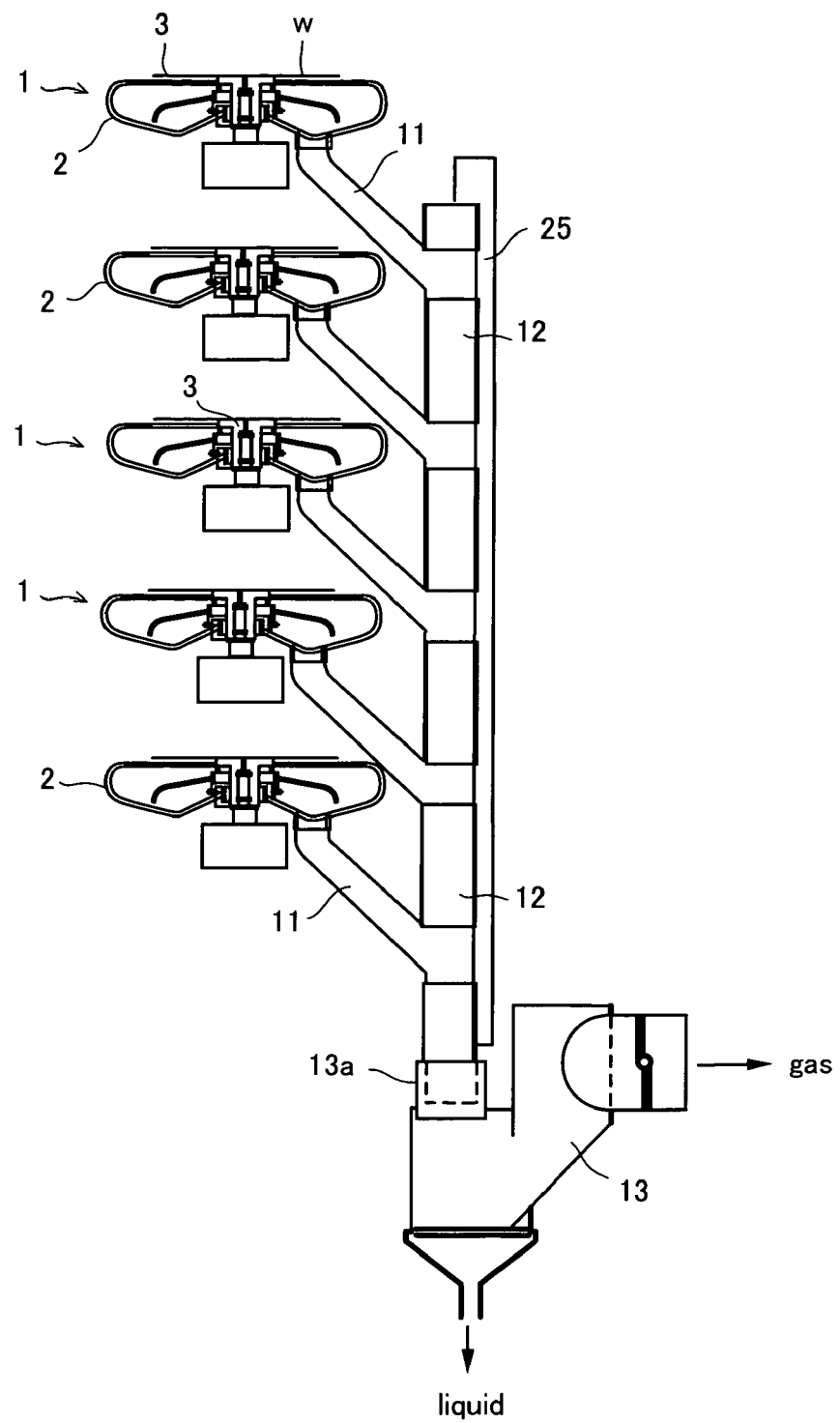
FIG. 2 shows the structure of waste solution pipes.
Figure 3:
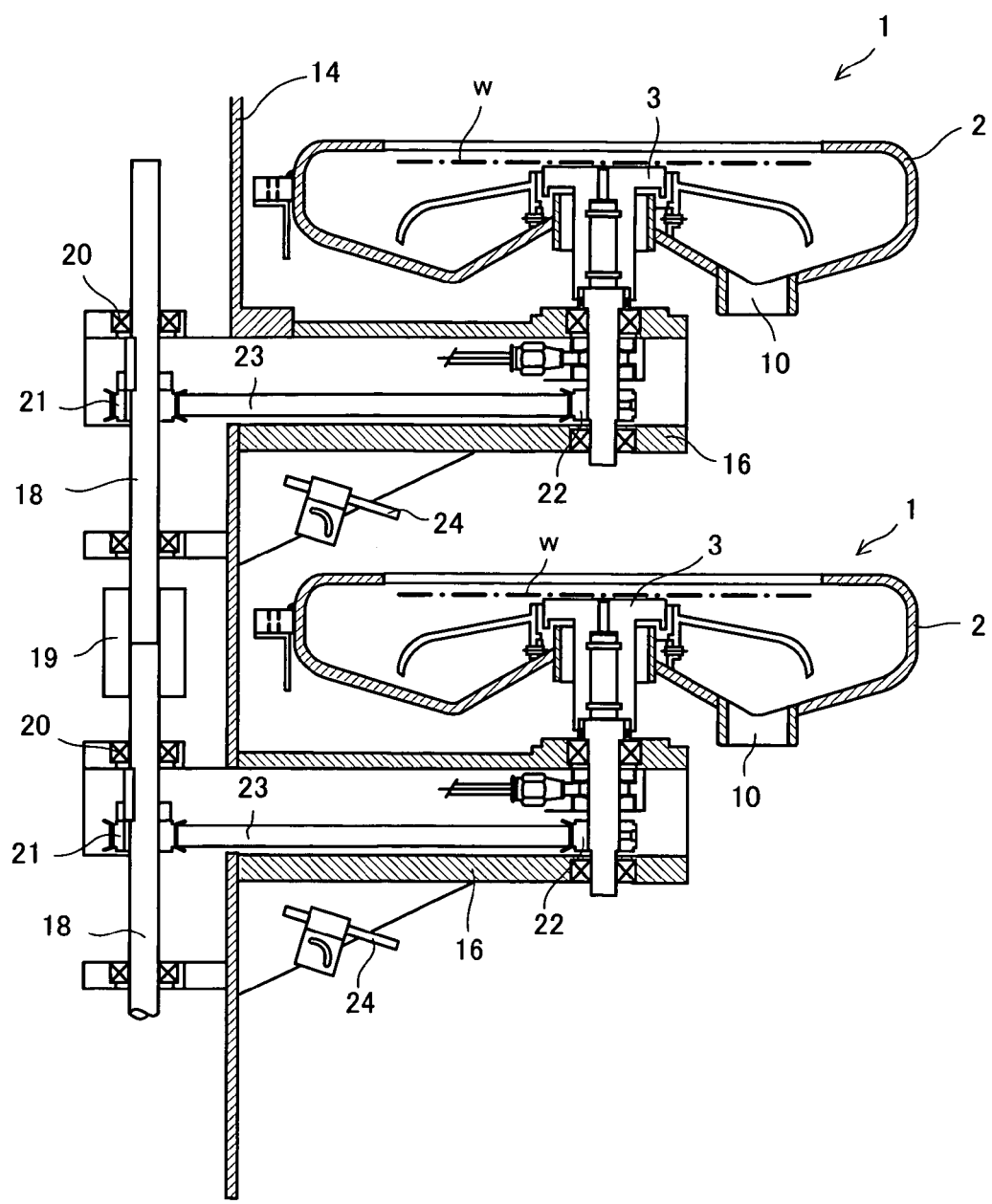
FIG. 3 shows the relationship between a chuck and a fixing member in a state where a cup is in an elevated position.
Figure 4:
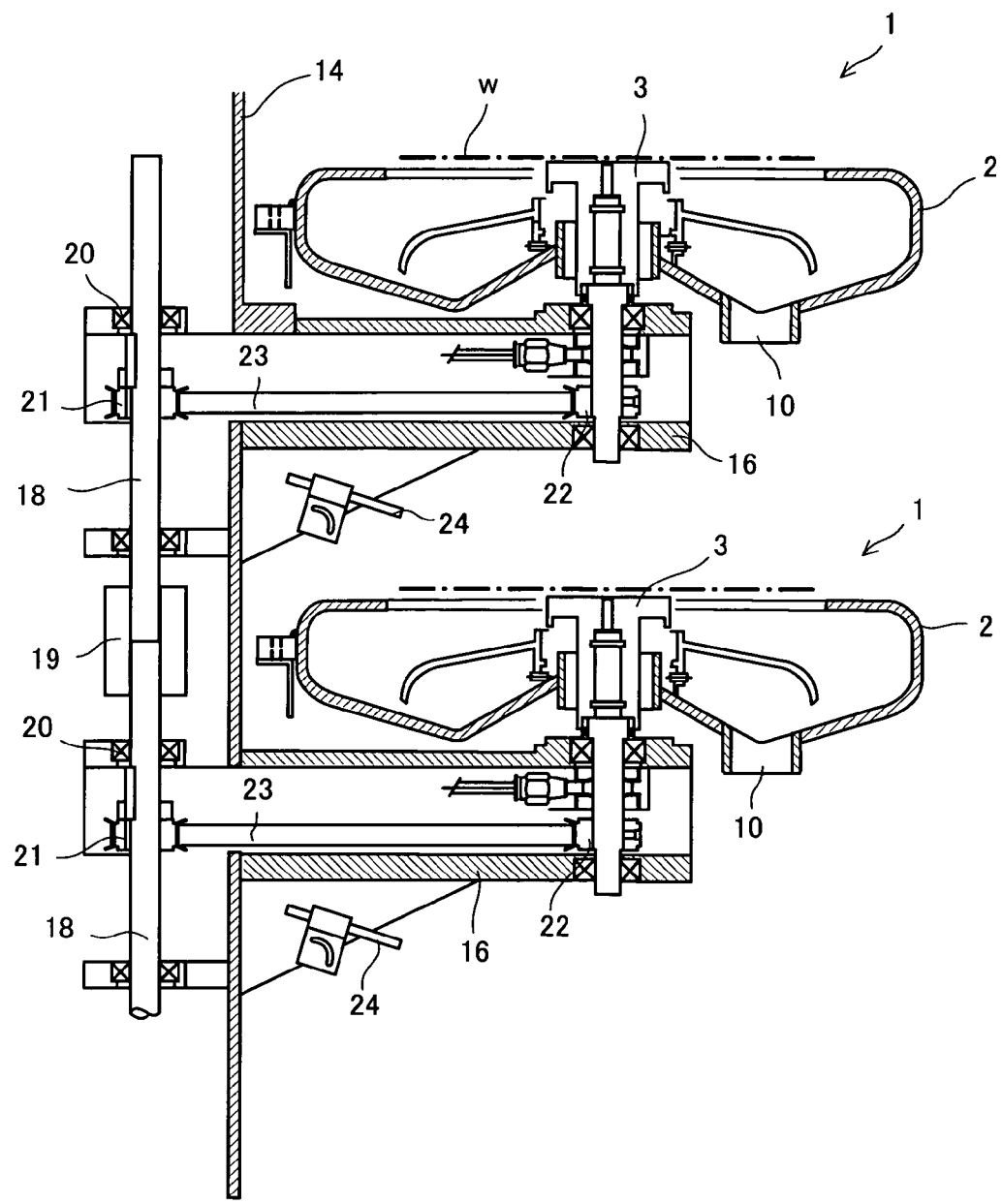
FIG. 4 shows the relationship between the chuck and the fixing member in a state where the cup is in a lowered position.

As shown in FIG. 2, a drain hole 10 opens to the bottom surface of the cup 2, and a waste solution pipe 11 is connected to the drain hole 10. The waste solution pipe 11 extends obliquely downward and leads to a vertical pipe 12. The vertical pipes 12, each of which is provided with respect to each cup 2, are joined into one pipe, and the lower end thereof is engaged into a gas-liquid separator 13 in a sate of being slidable.

An attachment port 13a for the gas-liquid separator 13 is provided with a Teflon ring of low friction. Consequently, if the vertical pipe 12 attached thereto is elevated or lowered, only little friction is generated, and also sufficient sealing property is obtained.

The waste solution pipes 11 and the vertical pipes 12 are attached to a waste solution pipe stay 25 extending in the vertical direction, and the waste solution pipe stay 25 is jointed to the supporting post 7 of the elevator member 5. Accordingly, when the elevator member 5 is elevated or lowered by driving the cylinder unit 6, the cups 2 supported by the arms 8, and the waste solution pipes 11 and the vertical pipes 12 supported by the waste solution pipe stay 25 are elevated or lowered together.

The chuck 3 is supported by a fixing member 14. The fixing member 14 is comprised of a hollow supporting post 15 which is disposed in the vertical direction and hollow arms 16 which extend horizontally from the hollow supporting post 15 to each processing unit 1. A drive shaft 18 is disposed in the vertical direction within the hollow supporting post 15, the drive shaft being driven by a motor which is not shown in the drawing.

The drive shaft 18 is common to all processing units 1, and is divided into sections corresponding to each processing unit 1, and each of the divided sections of the shaft 18 is jointed by a universal joint 19 with respect to each other. Also, each shaft 18 is supported by bearings 20 in a state of being rotatable.

A drive pulley 21 is fixed to each drive shaft 18, and a driven pulley 22 is fixed to the axis of the chuck 3. A timing belt 23 is provided between the drive pulley 21 and the driven pulley 22 and accommodated in the horizontal arm 16.

A nozzle for rinse liquid 24 is attached to a bracket which is provided in the corner between the hollow supporting post 15 and the arm 16. The angle of the nozzle for rinse liquid 24 with respect to a substrate W can be adjusted.

In operation, the cylinder unit 6 is contracted and thereby all the cups 2 are unitarily lowered by around 15 mm. As a result, the top surface of the chuck 3 is located in a slightly upper position with respect to the top surface of the cup 2. In this state, a substrate W is mounted on the chuck 3 and attracted.

Next, the cylinder unit 6 is extended and thereby all the cups 2 are unitarily elevated so as to accommodate the substrate W therein. In this state, developing liquid is dropped from the nozzle for developing liquid 9 onto the center of the substrate W. Also, a motor (not shown in the drawing) is driven to rotate the chuck 3 (the substrate W) via the drive shaft 18 and the timing belt 23, so that the developing liquid can cover the entire surface of the substrate W. Next, the rotation is stopped, and development is conducted.

When the development is completed after a predetermined period of time, the substrate W is rotated again, so that the developing liquid is dispersed from the substrate W by centrifugal force. The dispersed liquid is directed to the gas-liquid separator 13 through the drain hole 10 and the waste solution pipe 11, and separated into gas and liquid. The withdrawn liquid can be recycled as developing liquid after being adjusted by mixing with mother liquid, water or new liquid.

Also, after the developing liquid is withdrawn, rinse liquid is ejected from the nozzle for rinse liquid 24 onto the substrate W. A waste solution including the rinse liquid and the developing liquid is directed to the gas-liquid separator 13 through the drain hole 10 and the waste solution pipe 11, and discharged therefrom.

Figure 5:
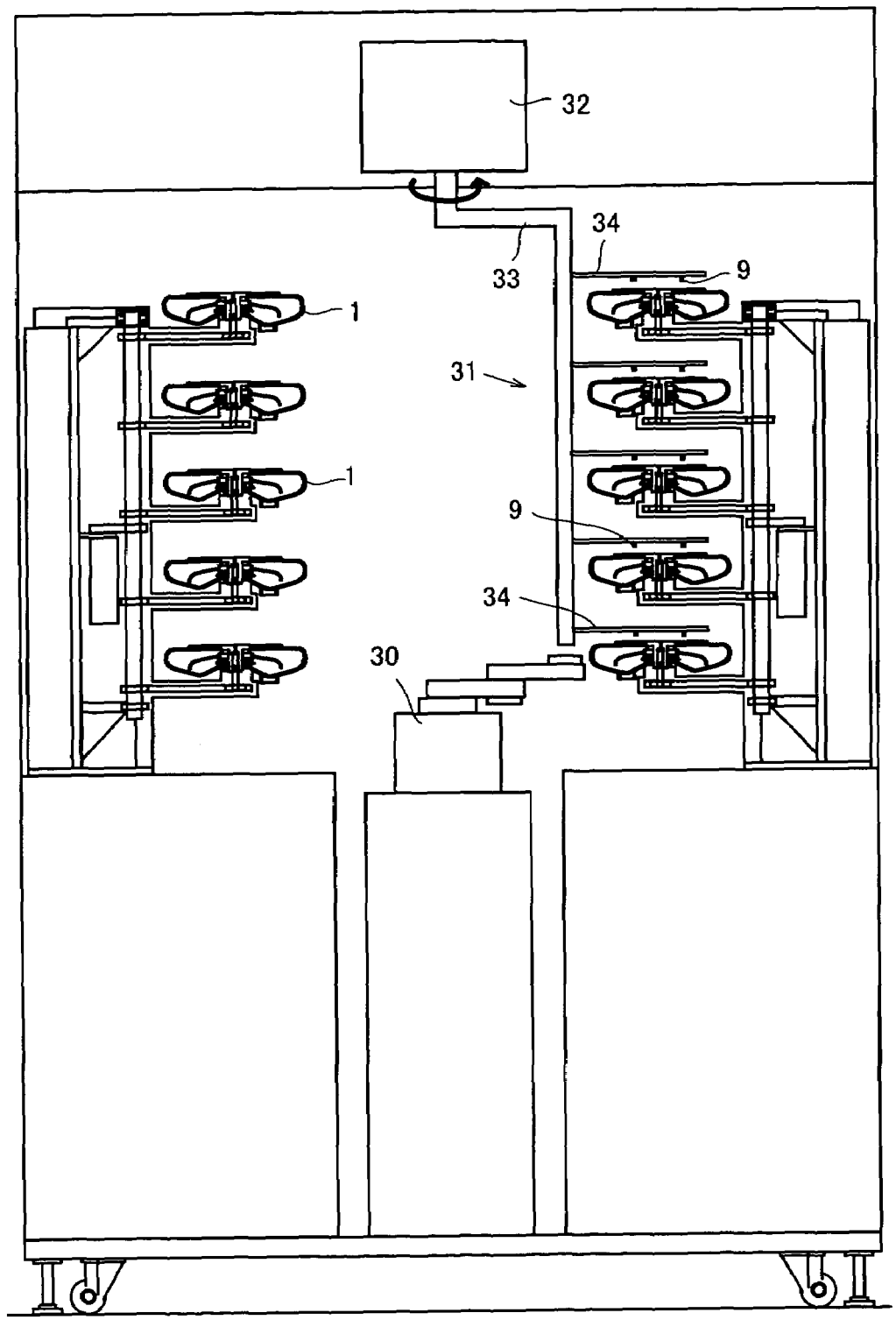
FIG. 5 shows another embodiment which uses a plurality of multi-stage type processing apparatuses.

FIG. 5 shows another embodiment which uses a plurality of multi-stage type processing apparatuses. In this embodiment, a transfer robot 30 is provided in the center of the multi-stage type processing apparatuses (two in the drawing), and a nozzle mechanism 31 is positioned above the transfer robot 30.

The nozzle mechanism 31 is comprised of a motor 32 having an axis of facing downward, a crank 33 rotated by the motor 32, and arms 34 extending from the crank 33 horizontally. The nozzle for developing liquid 9 is disposed in the arm 34. However, it is also possible to attach the nozzle for rinse liquid 24 instead of the nozzle for developing liquid 9.

In operation, when the motor 32 is driven, the arm 34 is rotated horizontally and developing liquid is supplied to processing units 1 of one multi-stage type processing apparatus. After this is completed, the arm 34 is rotated horizontally again and developing liquid is supplied to processing units 1 of the other multi-stage type processing apparatus. After this is completed, the substrates W are drawn from the processing units by using the transfer robot 30 one by one.

As is explained in the above, in the processing apparatus according to the present invention in which processing units, each of which is comprised of the cup and chuck, are stacked in the vertical direction, by separating the cups and the chucks, all the cups are elevated and lowered unitarily, and all the chucks are only rotated without being elevated and lowered. Specifically, since the rotated member and the elevated and lowered member are separated, the mechanism of the apparatus can be simplified and the maintenance can be facilitated.

Also, since all the shafts are driven by the single motor, uniform processing can be conducted among the processing units.

In addition, since the developing liquid is withdrawn and recycled, it is possible to utilize the developing liquid. Also, by dividing the shafts into plural ones, it is possible to improve the maintenance efficiency.

What is claimed is:

1. A multi-stage type processing apparatus comprising:
a plurality of processing units which are provided apart from each other in the vertical direction, each unit having a cup surrounding a substrate and a chuck for retaining and rotating a substrate,
wherein the cups and the chucks are separated, all the cups being supported by an elevator member so as to be elevated and lowered unitarily and all the chucks being supported by a fixing member,
the fixing member comprising a hollow vertical support post and plural hollow arms extending from the support post to each chuck,
and rotation drive force is distributed from a common drive shaft which is positioned within the support post and oriented in the vertical direction.

2. The multi-stage type processing apparatus according to claim 1, wherein one of an ejection nozzle for developing liquid and an ejection nozzle for rinse liquid is provided on said elevator member with respect to each processing unit, and the other is provided on said fixing member with respect to each processing unit.

3. The multi-stage type processing apparatus according to claim 1, wherein a plurality of multi-stage type processing apparatuses are disposed in a group, an arm rotated with respect to the horizontal plane is provided in a center of the group of apparatuses, an ejection nozzle for developing liquid or an ejection nozzle for rinse liquid is attached to the arm, and the ejection nozzle for developing liquid or the ejection nozzle for rinse liquid can move back and forward with respect to an upper portion of the processing units in one of the multi-stage processing apparatuses by rotation of the arm.

4. The multi-stage type processing apparatus according to any one of claims 1–3, wherein waste solution pipes, each of which connects to each cup, are supported to be elevated and lowered unitarily by said elevator member.

5. The multi-stage type processing apparatus according to claim 4, wherein said waste solution pipes are joined into one pipe and connected to a gas-liquid separator.

6. A multi-stage type processing apparatus comprising:
a plurality of processing units which are provided apart from each other in the vertical direction, each unit having a cup surrounding a substrate and a chuck for retaining and rotating a substrate,
wherein the cups and the chucks are separated, all the cups being supported by an elevator member so as to be elevated and lowered unitarily and all the chucks being supported by a fixing member, and rotation drive force is distributed from a common drive shaft which is positioned in the vertical direction, wherein said drive shaft is divided into plural sections with respect to each processing unit, and each of the divided shaft sections are jointed by a universal joint.

7. The multi-stage type processing apparatus according to claim 6, wherein a timing belt is provided between each chuck and each drive shaft, and drive force is transmitted by using the timing belt.

8. The multi-stage type processing apparatus according to claim 6, wherein one of an ejection nozzle for developing liquid and an ejection nozzle for rinse liquid is provided on said elevator member with respect to each processing unit, and the other is provided on said fixing member with respect to each processing unit.

9. The multi-stage type processing apparatus according to claim 6, wherein a plurality of multi-stage type processing apparatuses are disposed in a group, an arm rotated with respect to the horizontal plane is provided in a center of the group of apparatuses, an ejection nozzle for developing liquid or an ejection nozzle for rinse liquid is attached to the arm, and the ejection nozzle for developing liquid or the ejection nozzle for rinse liquid can move back and forward with respect to an upper portion of the processing units in one of the multi-stage processing apparatuses by rotation of the arm.

* * * * *